(12) United States Patent
Duquette et al.

(10) Patent No.: US 6,848,975 B2
(45) Date of Patent: Feb. 1, 2005

(54) ELECTROCHEMICAL PLANARIZATION OF METAL FEATURE SURFACES

(75) Inventors: David J. Duquette, Loundonville, NY (US); Lisa J. Loparco, Mechanicville, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 14 days.

(21) Appl. No.: 10/409,795

(22) Filed: Apr. 9, 2003

(65) Prior Publication Data

US 2003/0220052 A1 Nov. 27, 2003

Related U.S. Application Data

(60) Provisional application No. 60/371,190, filed on Apr. 9, 2002.

(51) Int. Cl.[7] .................................................. C25F 3/02
(52) U.S. Cl. .................... 451/41; 204/129.1; 451/42; 451/285
(58) Field of Search ............................ 451/41, 42, 285; 204/129.1, 129.65, 129.7, 212, 28, 214 M, 231, 228, 252, 263–266, 237–238, 241, 273, 297 R, DIG. 7

(56) References Cited

U.S. PATENT DOCUMENTS

| | | | | |
|---|---|---|---|---|
| 3,692,639 A | * | 9/1972 | Delmousos | ................... 205/96 |
| 3,703,458 A | * | 11/1972 | Read et al. | ................... 204/198 |
| 3,849,270 A | * | 11/1974 | Takagi et al. | ............... 438/400 |
| 4,073,708 A | * | 2/1978 | Hicks, Jr. | ................... 205/574 |
| 4,238,310 A | * | 12/1980 | Eckler et al. | ................ 204/252 |
| 4,971,676 A | * | 11/1990 | Doue et al. | ................. 118/503 |
| 5,096,550 A | * | 3/1992 | Mayer et al. | ............... 205/642 |
| 6,294,467 B1 | * | 9/2001 | Yokoyama et al. | ......... 438/680 |
| 6,303,014 B1 | * | 10/2001 | Taylor et al. | ............... 205/103 |

FOREIGN PATENT DOCUMENTS

| | | |
|---|---|---|
| EP | 0699782 A1 | 3/1996 |
| WO | WO 01/88229 A1 | 11/2001 |
| WO | WO 02/23616 A1 | 3/2002 |

OTHER PUBLICATIONS

Contolini, R. J. et al., "Electrochemical Planarization Of Ulsi Copper," Solid State Technology, Jun. 1997, pp. 155, 156, 158, 160 & 162.

Contolini, R. J. et al., "Electrochemical Planarization For Multilevel Metallization," The Electrochemical Society, Inc., Sep. 1994.

Hensel, K. B., "Electropolishing," Metal Finishing, Elsevier Science Publishing, New York, NY, vol. 98, No. 1, pp. 440, 441–444, 446–448.

* cited by examiner

Primary Examiner—Lee D. Wilson
Assistant Examiner—Anthony Ojini
(74) Attorney, Agent, or Firm—Wolf, Greenfield & Sacks, P.C.

(57) ABSTRACT

One aspect is directed to an improved method for polishing an integrated circuit. According to one aspect, metal features deposited on an integrated circuit are polished using electropolishing techniques. Because electropolishing is used, polishing avoids removal of softer insulating materials of the integrated circuit.

11 Claims, 4 Drawing Sheets

ELECTROCHEMICAL PLANARIZATION OF METAL FEATURE SURFACES

RELATED APPLICATION

This application claims the benefit under Title 35, U.S.C. § 119(e) of co-pending U.S. Provisional Application Ser. No. 60/371,190, filed Apr. 9, 2002, entitled "Electrochemical Planarization of Copper" by David J. Duquette and Lisa J. Loparco, the contents of which are incorporated herein by reference.

FIELD OF THE INVENTION

The invention relates generally to processes for forming integrated circuits, and more particularly, to processes for finishing metal feature surfaces of integrated circuits.

BACKGROUND OF THE INVENTION

Integrated circuits are typically prepared by first patterning a dielectric layer on a wafer (e.g., a silicon wafer) with features as trenches, vias, etc. These features are deposited or formed naturally on a surface of the wafer, and the features are then coated with a barrier layer to prevent electro-migration of metal conducting features into the dielectric layer. The barrier layers are sometimes coated with an adhesion layer to bind the metal conductors to the dielectric. The features are then filled with metal, usually copper and/or its alloys, aluminum and/or its alloys, or tungsten.

The metal deposition process usually results in an excess or overburden of metal on the dielectric surface which must be removed such that the metal interconnects form an absolutely planar surface with the dielectric. This planar quality is commonly referred to as global planarization wherein the surface of the wafer is substantially even over the entire surface. Additional layers are generally deposited over the planar surface. A repeated process of depositing material and performing a planarization of the material surface is typically used to construct an integrated circuit having a multilayer structure. Success of this multilayer process depends on the achieving global planarization at each layer of the formation process.

The process of planarization currently used to polish patterned wafers is referred to in the art as chemical mechanical planarization, or CMP. Traditionally, CMP of patterned wafers has been performed by chemically etching the metal using an abrasive slurry containing hard oxide particles that are suspended in an aqueous solution. The etching process forms a metal oxide on the surface of the metal, and, in a physical sanding action, the abrasive then removes the metal oxide, leaving bare metal to be reoxidized. In present day wafer processing, silica is the dielectric typically used, and silica is usually formed by thermally oxidizing the silicon wafer. Silica is a hard, glassy-like material and usually polishes at a much slower rate than the metal overburden or the metal features that are exposed as the overburden is removed.

SUMMARY OF THE INVENTION

Future generations of integrated circuits are being designed with dielectrics that have lower dielectric constants to increase the speed of the devices. The dielectrics under consideration are generally polymer-like and very soft or friable relative to the metal overburden and the metal features that intersect the surfaces of the wafers when the overburden is removed. For example, the materials being considered are polymer-based materials such as spun-on polymers, aerogels, and xerogels. Thus, the hard abrasive particles used to remove the overburden either damage the low dielectric constant materials or result in poor planarization because of selective removal of the softer material. As a result of this selective removal, global planarization of the surface is not achieved as erosion of the dielectric material surface occurs.

According to one aspect of the invention, a method is provided for polishing an integrated circuit comprising a dielectric layer upon which are formed a plurality of features, the method comprises depositing a metallic layer on a surface of a dielectric layer forming at least one of the plurality of features and polishing a surface of the metallic layer. The act of polishing comprises exposing a surface of the metallic layer to an electrolyte solution of an electrochemical cell, providing a first electrode of the electrochemical cell and having a potential being maintained at a constant voltage in a stable electropolishing region of the electrochemical cell, maintaining a potential of the integrated circuit, forming an anode of the electrochemical cell, and providing a second electrode, the second electrode forming a cathode of the electrochemical cell.

According to another aspect of the invention, the method further comprises depositing, prior to depositing the metallic layer, a non-metallic barrier layer on the surface of the dielectric layer. According to another aspect of the invention, the method further comprises removing a portion of the metallic layer that extends above the surface of the dielectric layer. According to another aspect of the invention, the method further comprises stopping the act of polishing when the metal extending above the surface of the dielectric layer is substantially removed. According to another aspect of the invention, the method further comprises stopping the act of polishing when the surface of the metallic layer is located substantially planar to the surface of the dielectric layer. According to another aspect of the invention, the stable electropolishing region is associated with a voltage range and the method further comprises maintaining the potential of the first electrode proximate to the center of the voltage range.

According to one embodiment of the invention, the electrolyte solution includes an oxidizing acid, and the method comprises an act of electropolishing the surface of the metallic layer using the oxidizing acid. In another embodiment of the invention, the oxidizing acid includes at least one of a group comprising phosphoric acid and nitric acid. In yet another embodiment of the invention, the oxidizing acid includes at least one of a group comprising othophosphoric acid and pyrophosphoric acid.

According to one embodiment of the invention, the method comprises an act of maintaining electrical contact between the first electrode and the electrolyte solution.

According to another embodiment, the metallic layer includes copper, and the act of polishing comprises an act of removing an overburden of copper by electropolishing a surface of the copper.

According to another aspect of the invention, an electrochemical polishing apparatus is provided including an electrochemical cell comprising a first electrode having a potential maintained in a stable electropolishing region of the electrochemical cell, the first electrode forming an anode of the electrochemical cell, an electrolyte solution in electrical contact with the first electrode, the electrolyte solution contacting at least one metallic layer disposed on a dielectric layer of an integrated circuit to be polished, and a second electrode serving as a cathode of the electrochemical cell. In one embodiment of the invention, the stable electropolishing region of the electrochemical cell is associated with a voltage range, and wherein the apparatus further comprises means for maintaining the potential of the first electrode proximate to a center of the voltage range.

According to another embodiment of the invention, the electrolyte solution includes an oxidizing acid that contacts the at least one metallic layer. In one embodiment, the oxidizing acid includes at least one of a group comprising phosphoric acid and nitric acid. In another embodiment, the oxidizing acid includes at least one of a group comprising othophophoric acid and pyrophosphoric acid.

According to another embodiment of the invention, the first electrode and the electrolyte solution are in electrical contact. In yet another embodiment of the invention, the at least one layer includes copper material, and the electrochemical cell is adapted to remove an overburden of the copper material by electropolishing a surface of the copper material. According to another embodiment of the invention, the apparatus further comprises a third electrode having a constant reference voltage.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

DETAILED DESCRIPTION

As discussed above, there is a need for a polishing method for polishing metal features deposited on a wafer, as conventional CMP processes selectively remove low k materials. Selective erosion produced by such conventional CMP procedure is shown in FIG. 1.

Figure 1:
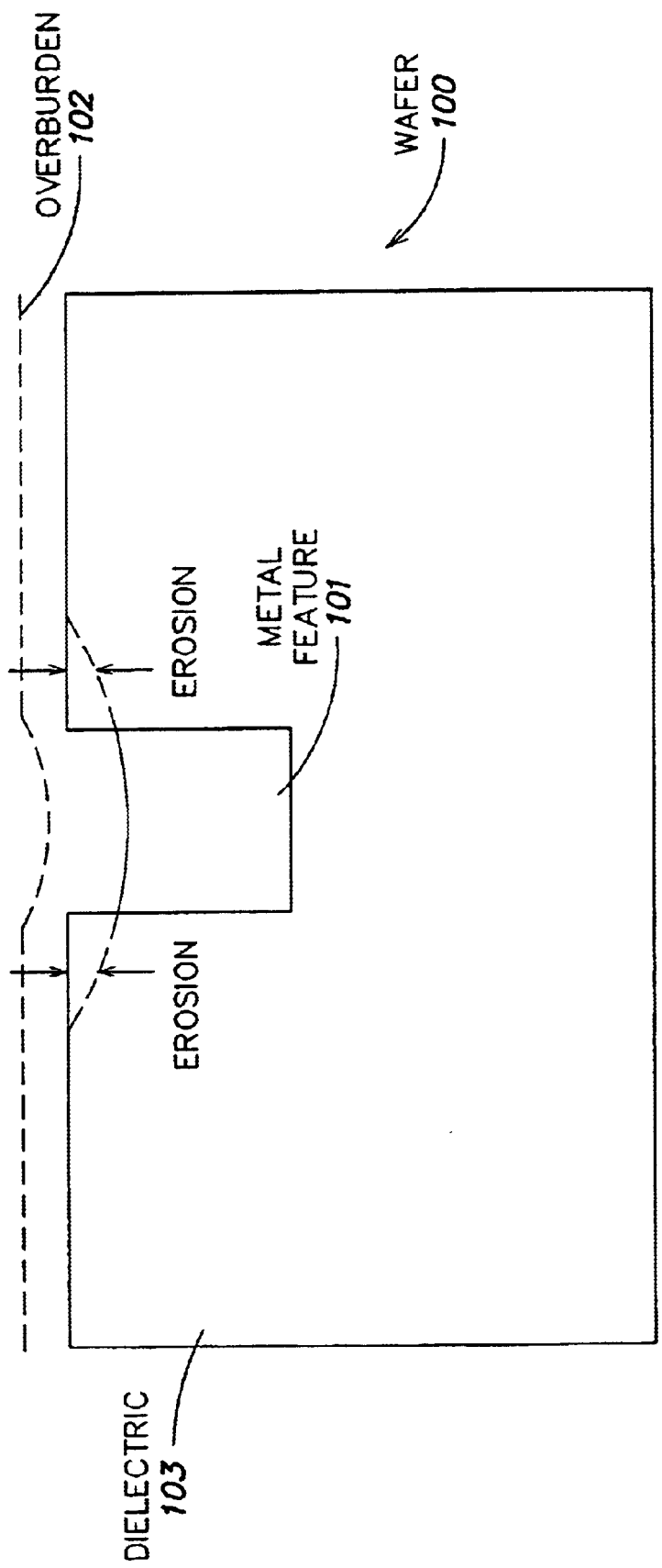
FIG. 1 shows erosion of an integrated circuit surface due to a conventional CMP process.

For example, as shown in FIG. 1, a wafer 100 having one or more metal features deposited within a dielectric material 103 is polished using a conventional CMP process. Because dielectric material 103 of wafer 100 is softer than material of overburden 102, material 103 is eroded more quickly than the overburden 102 of metal feature 101. In this manner, planarization is localized (i.e., the surface of the wafer including the metal feature 101 is not globally planar) and therefore, the wafer is not suitable for depositing additional layers. According to one aspect of the invention, it is realized that because low dielectric constant materials with thin films of electrodeposited metal are used, there is a need for non-abrasive polishing methods because low k material is readily damaged by conventional CMP methods.

According to one aspect of the invention, a method is provided for polishing the surface of an integrated circuit. The integrated circuit surface may include, for example, a metal layer, a non-metallic barrier material, and a dielectric. According to one aspect of the invention, polishing and subsequent planarization of the surface of a processed wafer is achieved by electropolishing the overburden. Because electropolishing is used, and the dielectric is essentially an insulator, the polishing process avoids removal of the softer insulating material as only conducting metal surfaces will be polished. More particularly, because electropolishing selectively polishes the metal surface (and not the insulating material), erosion of softer material is avoided.

According to one embodiment of the invention, the surface may be electropolished by utilizing an oxidizing acid under carefully controlled electrochemical potential control to remove the metal overburden. Acids that may be used, for example, include those of the phosphoric acid family including othophosphoric and pyrophosphoric acids. A similar result may be achieved by using nitric acid if the viscosity of the electropolishing bath is controlled by the addition of alcohols such as methanol. It should be appreciated that there are many polishing materials and procedures that may be used for electropolishing a metallic overburden of an integrated circuit, and the invention is not limited to any particular material or procedure.

In electropolishing monolithic copper, the polishing rate is controlled by applying either a constant current density or a constant voltage. According to one aspect of the invention, it is realized that polishing of a composite wafer having metal features patterned onto a dielectric can be achieved if the electrochemical potential is maintained within a specific range. The nature of the dielectric is not important and various aspects of the invention work equally well for polymer-like dielectrics.

Figure 2:
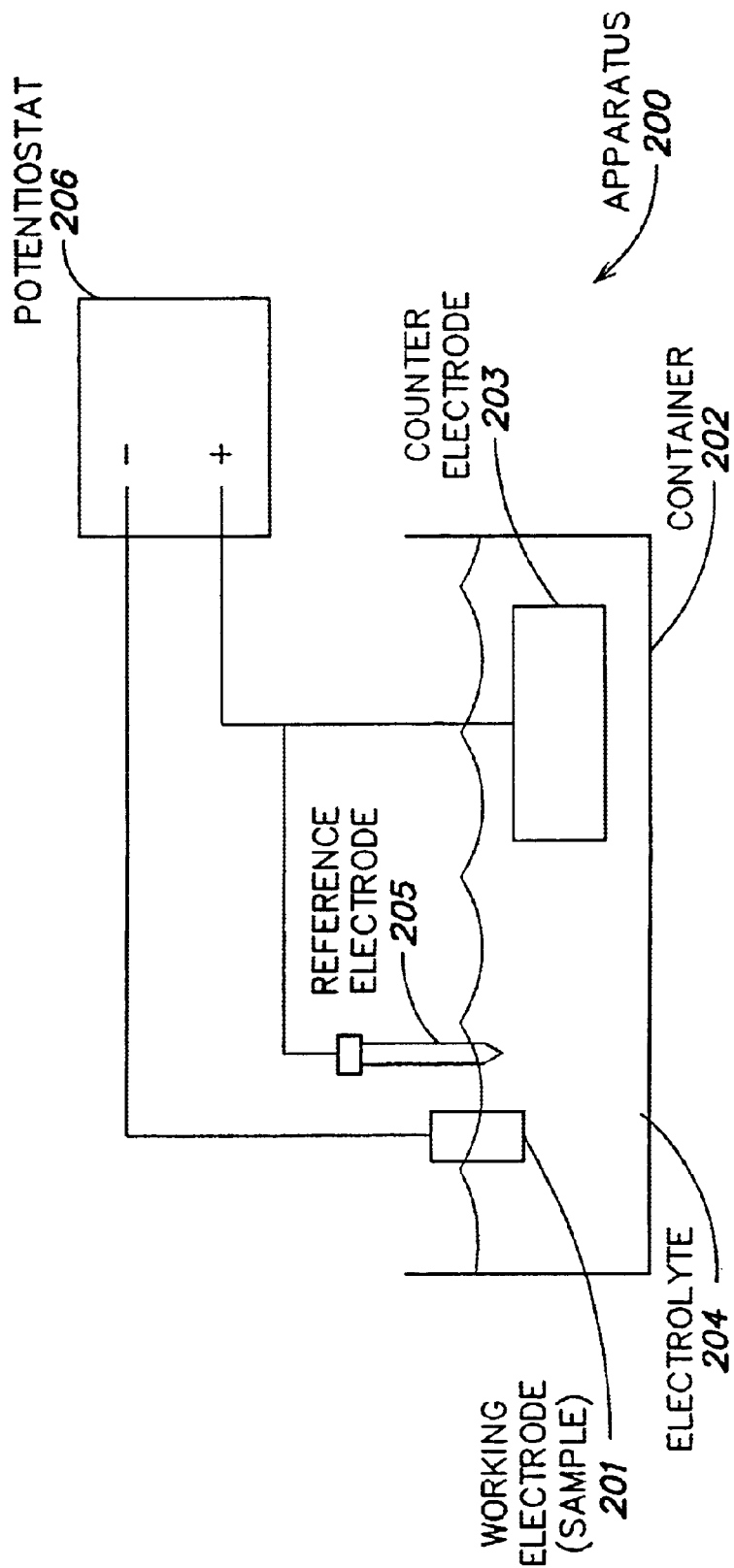
FIG. 2 shows an example apparatus used for polishing an integrated circuit according to one embodiment of the invention.

FIG. 2 shows an example apparatus 200 that may be used to electropolish an integrated circuit according to one embodiment of the invention. According to one aspect of the invention, the electrochemical potential is controlled in a three-electrode (201, 203, 205) electrochemical cell with one of the electrodes being a reference electrode 205 having a fixed potential. According to one embodiment of the invention, the wafer sample 201 is connected as the anode in the cell with an inert cathode as the third electrode 203 (counter electrode) as shown in FIG. 2.

The sample 201 is immersed in an electrolyte solution 204 in a container 202 as shown in FIG. 2. As discussed above, electrolyte solution 204 may include an oxidizing acid such as, for example, phosphoric, nitric, or other acids. It should be appreciated that other oxidizing acids may be used, and the invention is not limited to any particular implementation.

Also, it is realized that the polishing rate may be controlled by applying a constant current density or voltage to the electrochemical cell. A potentiostat 206 may be used, for example, to maintain a voltage between cathode 203 and sample 201 thereby controlling the polishing rate. Although a potentiostat is used in the configuration discussed above, it should be appreciated that any method for controlling voltage or current density may be used, and the invention is not limited to any particular implementation.

The wafer sample 201 may be effectively planarized when the overburden of copper is cleared from the surface of the dielectric. The sample to be polished may be monitored to determine when the polishing process should be stopped, and the sample may be monitored using any suitable method (e.g., visually).

As discussed above, the polishing rate may be controlled by applying a constant voltage to an electrochemical cell. A typical voltage-current curve defining a polishing voltage range that may be used in association with apparatus 200 is shown in FIG. 3.

Figure 3:
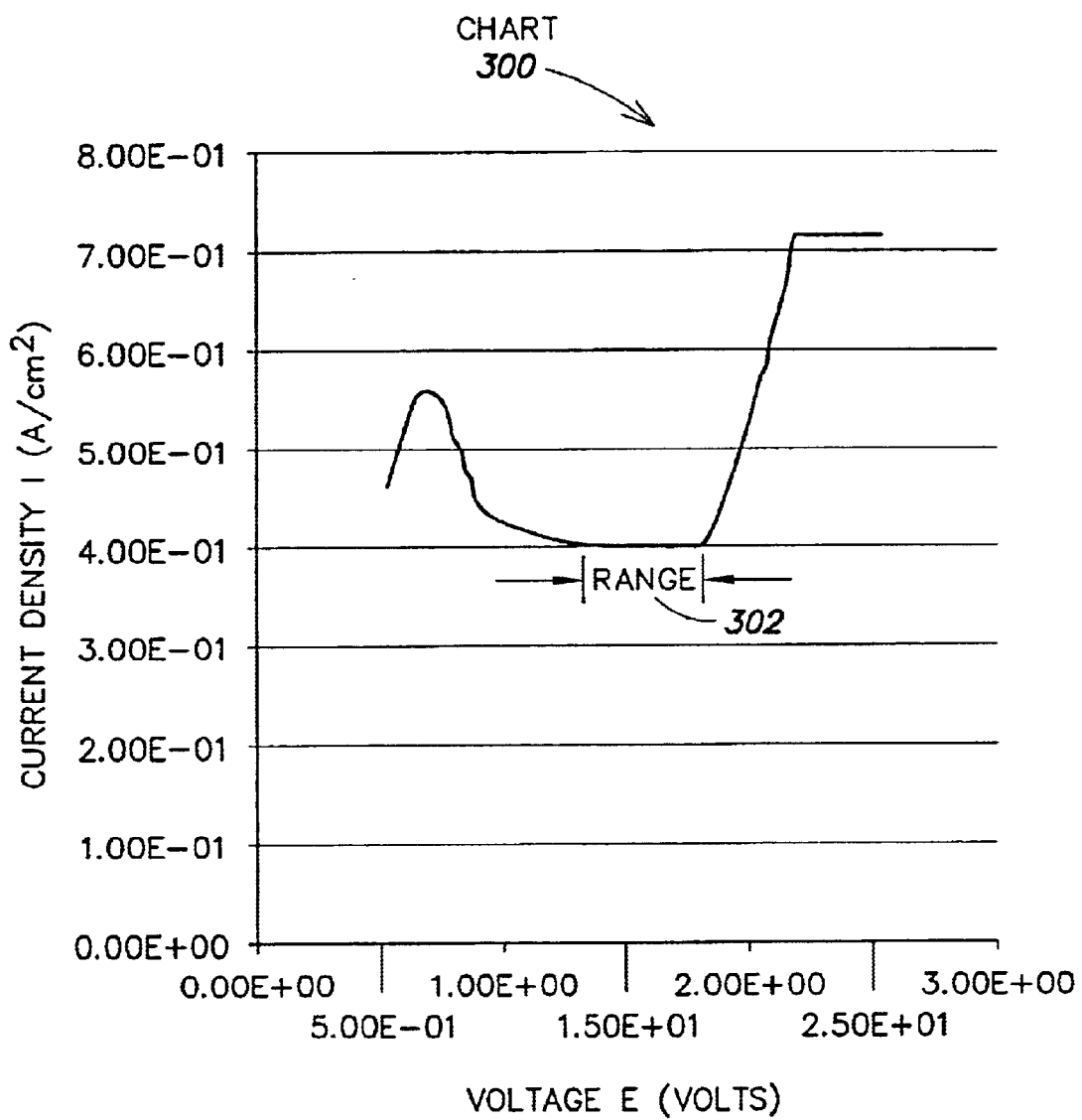
FIG. 3 is a graph showing cell voltage as a function of current density using a copper plate sample in an electrolyte solution of phosphoric acid and deionized water according to one embodiment of the invention.

In particular, FIG. 3 shows a chart 300 graphing voltage versus current density for an example apparatus similar to the configuration in apparatus 200. Voltage is maintained (e.g., by potentiostat 206) in a range where polishing occurs. According to one aspect of the invention, it is realized that polishing of a wafer having metal features can be performed if the electrochemical potential of the cell is maintained within a particular range where polishing occurs (e.g., in a stable region of the electrochemical cell).

The following practical polishing example using apparatus 200 shown in FIG. 2 illustrates various aspects of the present invention. It should be appreciated that the following example is one method for polishing an integrated circuit, and that the invention is not limited to any particular implementation.

EXAMPLE

A sample including an 18 $cm^2$ section of a patterned silicon wafer with an overburden of copper on its surface may be polished according to various embodiments of the invention. A polishing electrolyte comprising 350 ml de-ionized water and 700 ml phosphoric acid may be used.

A three-electrode electrochemical cell as shown in FIG. 2 may be used with the sample as the working electrode (anode), a piece of copper sheet as the secondary electrode (cathode) and a saturated calomel electrode as the reference electrode. Any reference electrode can be used, and several standard ones are available commercially. For example, a piece of copper wire may be used as a reference electrode which is more convenient for industry use.

The sample may be electropolished, for example, using a commercially-available potentiostat and corrosion software in potentiostatic mode using the potential determined from the previously generated voltage-current curve as shown in FIG. 3. Potentiostat and corrosion software is available from a variety of vendors including, but not limited to, Princeton Applied Research, Oak Ridge, Tenn., Gamry Instruments, Warminster, Pa., and others. It should be appreciated that other polishing apparatus may be used, and the invention is not limited to any particular apparatus.

Figure 4:
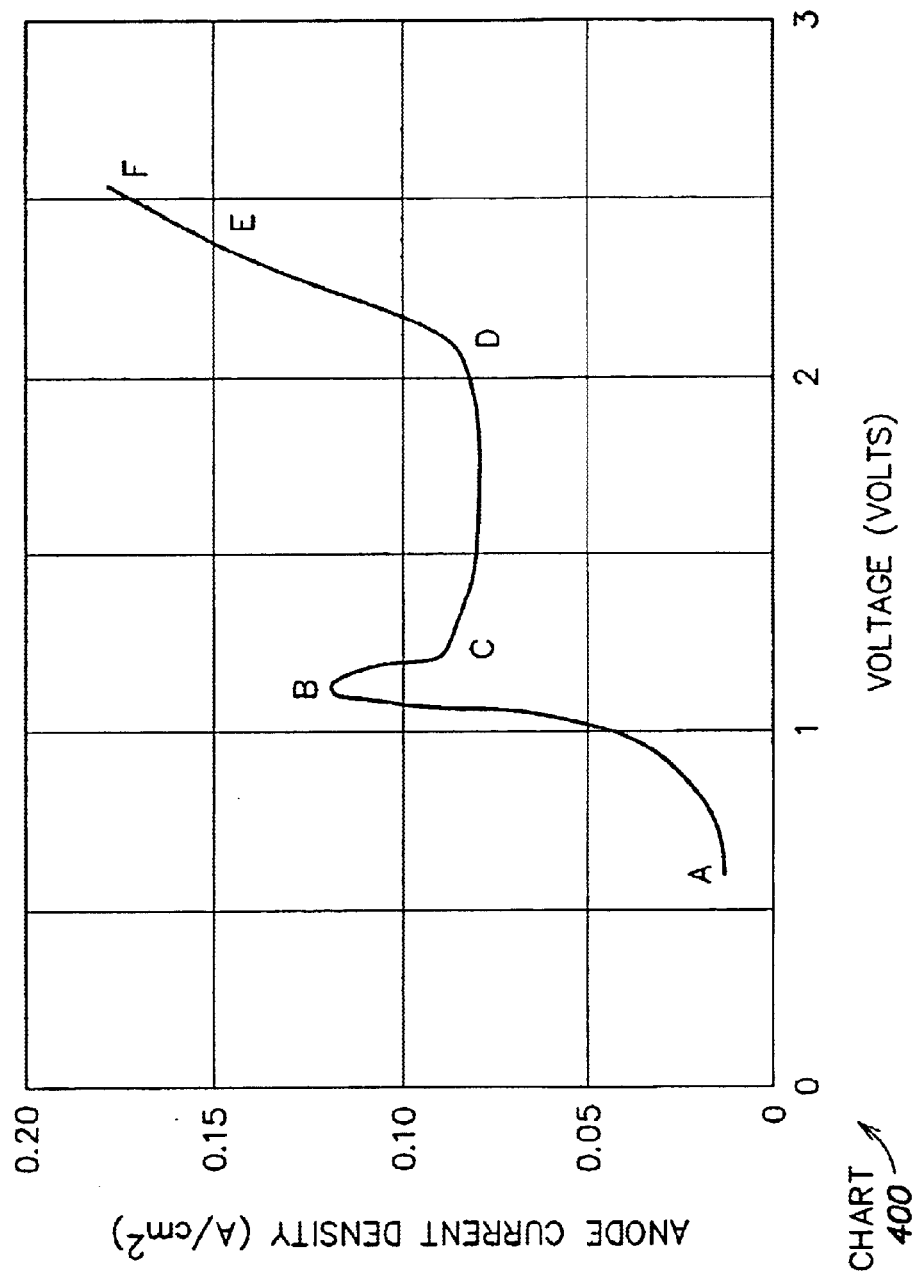
FIG. 4 is a graph showing cell voltage as a function of current density for electropolishing copper in an aqueous solution of phosphoric acid.

FIG. 4 shows a typical current-voltage relationship in electropolishing that varies depending on the electrolyte used and the metal to be polished. In particular, FIG. 4 depicts cell voltage as a function of anode current density for electropolishing monolithic copper in an aqueous solution of phosphoric acid as described in *ASM Metals Handbook, 8th Edition, Volume 8, Electrolytic Polishing*.

The current-voltage curve shown in FIG. 4 has five distinct regions:

A-B current density increases with potential and the surface has dull etched appearance B-C unstable condition C-D stable plateau region at which polishing film reaches point of equilibrium and polishing occurs D-E slow evolution of gas bubbles break polishing film and cause pitting E-F rapid evolution of gas bubbles causes pitting.

This curve is compared with the curve shown in FIG. 3 which is the curve generated using a sample of copper plate and an electrolyte solution of phosphoric acid and deionized water, and a potential may be chosen proximate to the center of the C-D region. As noted above, the curve would change if the metal and/or electrolyte were changed.

As noted previously, the curve shown in FIG. 3 may be generated, for example, by using a sample of copper plate in an electrolyte solution of phosphoric acid and deionized water. The curve shown in FIG. 3 predicts a polishing range 302 of approximately 1.25–1.75 volts vs. a standard calomel electrode for these conditions. As discussed above, a potential proximate to the center of the voltage range in the C-D region (stable region) may be used. For example, in a range of approximately 1.25–1.75 volts, a potential of approximately 1.5 volts may be used.

As also noted previously, the polishing range is dependent upon the material to be polished and the electrolyte solution used and is determined prior to polishing by generating a specific current-voltage curve for the specific situation. Therefore, the invention is not limited to any particular material to be polished or solution used.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method for polishing an integrated circuit comprising a dielectric layer upon which are formed a plurality of features, the method comprising acts of:

depositing a metallic layer on a surface of a dielectric layer forming at least one of the plurality of features;

polishing a surface of the metallic layer, the act of polishing comprising acts of:
exposing a surface of the metallic layer to an electrolyte solution of an electrochemical cell;
providing a first electrode of the electrochemical cell and having a potential being maintained at a constant voltage in a stable electropolishing region of the electrochemical cell;
maintaining a potential of the integrated circuit, forming an anode of the electrochemical cell; and
providing a second electrode, the second electrode forming a cathode of the electrochemical cell.

2. The method according to claim 1, further comprising an act of depositing, prior to depositing the metallic layer, a non-metallic barrier layer on the surface of the dielectric layer.

3. The method according to claim 1, further comprising an act of removing a portion of the metallic layer that extends above the surface of the dielectric layer.

4. The method according to claim 3, further comprising an act of stopping the act of polishing when the metal extending above the surface of the dielectric layer is substantially removed.

5. The method according to claim 3, further comprising an act of stopping the act of polishing when the surface of the metallic layer is located substantially planar to the surface of the dielectric layer.

6. The method according to claim 1, wherein the stable electropolishing region is associated with a voltage range, and wherein the method further comprises an act of maintaining the potential of the first electrode proximate to a center of the voltage range.

7. The method according to claim 1, wherein the electrolyte solution includes an oxidizing acid, and the method comprises an act of electropolishing the surface of the metallic layer using the oxidizing acid.

8. The method according to claim 7, wherein the oxidizing acid includes at least one of a group comprising phosphoric acid and nitric acid.

9. The method according to claim 7, wherein the oxidizing acid includes at least one of a group comprising othophophoric acid and pyrophosphoric acid.

10. The method according to claim 1, further comprising an act of maintaining electrical contact between the first electrode and the electrolyte solution.

11. The method according to claim 1, wherein the metallic layer includes copper, and the act of polishing comprises an act of removing an overburden of copper by electropolishing a surface of the copper.

* * * * *